United States Patent [19]

Blumenkranz

[11] Patent Number: 4,472,725

[45] Date of Patent: Sep. 18, 1984

[54] LC DELAY LINE FOR FEEDFORWARD AMPLIFIER

[75] Inventor: Robert M. Blumenkranz, Vancouver, Canada

[73] Assignee: Century III Electronics Inc., Vancouver, Canada

[21] Appl. No.: 344,786

[22] Filed: Feb. 1, 1982

[51] Int. Cl.³ .......................... H03F 1/26; H03H 7/32
[52] U.S. Cl. ................................. 330/149; 330/151; 333/139; 333/140
[58] Field of Search ...................... 330/65, 66, 67, 149, 330/151; 333/138, 139, 140, 174, 185

[56] References Cited

U.S. PATENT DOCUMENTS

| | | | |
|---|---|---|---|
| 3,046,500 | 7/1962 | Dewitz | 333/139 |
| 3,820,045 | 6/1974 | Igarashi | 333/185 |
| 3,886,470 | 5/1975 | O'Neil et al. | 330/149 |

OTHER PUBLICATIONS

Blumenkranz, "A Microprocessor Monitored Feed-Forward Super Trunk CATV Amplifier", C.C.T.A. Convention, Vancouver, British Columbia, May 1980.

Primary Examiner—James B. Mullins
Attorney, Agent, or Firm—Spensley, Horn, Jubas & Lubitz

[57] ABSTRACT

A tuneable lumped LC electronic delay line for delaying RF signals in a bandwidth of at least 100 MHz by a substantially constant amount throughout the band, the delay line including a plurality of deformable air coil inductors that are inductively coupled to one another, a plurality of capacitors connected between each inductor pair and electrical ground, and a reactive element connected at one end of the series of inductors and reactively coupled to electrical ground.

16 Claims, 10 Drawing Figures

LC DELAY LINE FOR FEEDFORWARD AMPLIFIER

FIELD OF THE INVENTION

This invention pertains to electronic delay lines and, in particular, tuneable electronic delay lines for feedforward amplifiers.

BACKGROUND

In cable communication systems it is often necessary to transmit signals long distances over coaxial cables. The strength of the transmitted signals decreases in proportion to the length of the cable over which the signals are transmitted, necessitating amplification of the signals at repeated intervals along the cable to maintain adequate signal strength. The electronic amplifiers used to amplify the signal inherently distort the signal as they amplify it. Ideally, such distortion is to be eliminated or reduced to some acceptable minimum level.

Feedforward amplifiers are able to provide relatively distortion-free amplification by extracting from the amplified signal a signal component representative of the distortion introduced by the amplifier, phase inverting that component, and then recombining the phase inverted distortion component with the amplified signal. The phase inverted distortion component cancels the distortion component in the amplified signal, leaving a relatively distortion-free amplified signal for transmission along the cable. To avoid further distortion, the signals must coincide precisely in time when they are recombined. To ensure such coincidence, delay means are provided to delay the signals and thereby compensate for time delays which arise when the signals pass through the various electronic components in the amplifier.

Two major design criteria govern the selection of a suitable delay means for inclusion in a feedforward amplifier. First, the delay means must delay signals passing therethrough for a precise time interval. For feedforward amplifiers passing signals in the 50 MHz-400 MHz band, the appropriate delay is on the order of a few nanoseconds, but the precise time delay required will vary from one amplifier to another. The second major design criterion requires that the delay means be matched to the impedance of the transmission cable in order to minimize attenuation of the signal.

One prior art technique utilized a short length of coaxial cable for the delay means in a feedforward amplifier. Because the delay means was constructed of cable identical to that comprising the main transmission cable, excellent impedance matching was obtainable. However, in order to adjust the time delay provided by such a coaxial cable segment, it is necessary to trim short pieces from the segment on a trial and error basis until the time taken for a signal to pass through the cable segment equals the desired time delay. This technique is extremely cumbersome and is not economically adaptable to the large scale volume production of feedforward amplifiers. Furthermore, the relatively bulky nature of such cable segments (about six feet of cable are typically required in each delay means) makes it difficult to package the amplifier which is preferably made as small as possible. In addition, the time delay characteristics of a cable segment are subject to change with temperature and so the vital design criteria mentioned above may be upset under field operating conditions.

Another prior art technique provided a delay line comprising a silicon substrate having a sapphire spiral precisely etched thereon (termed a "stripline" in the art). Computer control techniques were used to carefully control the etching process to yield a spiral having precise time delay and impedance characteristics. Such etched spirals may in practice only be adjusted by shortening the spiral length (wire jumpers are used for this purpose) which, in turn, varies the spiral time delay. This technique does not, however, enable independent adjustment of phase *or* time delay characteristics within a *range* of frequencies—which may be accomplished with the present invention. Furthermore, the time delay and impedance matching characteristics of such spiral elements are subject to change with temperature which is undesirable as mentioned above.

An object of the present invention is to provide a tuneable electronic delay line for a feedforward amplifier. The delay line may be installed in a feedforward amplifier and then adjusted to vary either its time delay or impedance matching characteristics, or both, as may be required to suit the operating requirements of the individual amplifier circuit with which the delay line is to function.

A related object is to provide a delay line for a feedforward amplifier which may be easily mass produced and which may be easily adjusted under volume production conditions.

SUMMARY OF THE INVENTION

In a preferred embodiment, the invention is directed to a tuneable electronic delay line for delaying signals passing between first and second end points. The delay line comprises a plurality of inductance coils connected in series between said first and second end points; a shunt capacitor connected between each connected inductance coil pair and electrical ground; a variable capacitor connected between the first end point and electrical ground; and, a reactive element connected between the second end point and electrical ground. Preferably, the reactive element comprises a short wire coil.

Advantageously, the coils and capacitors are closely confined within a metal enclosure. The enclosure includes a removable lid having a plurality of apertures for enabling access to the coils, the variable capacitor and the reactive element for tuning said delay line. The enclosure further includes a thermally and electrically conductive strap for connecting the enclosure to electrical ground and for conducting heat to the enclosure.

SUMMARY OF THE DRAWINGS

FIG. 5A is a graph showing degree of input loop cancellation ideally observed after tuning second delay means 22 as hereinafter described; first delay means 18 having been terminated to match the transmission line impedance. In FIG. 5A, signal attenuation in decibels relative to a reference line of "0" is plotted as the ordinate, and frequency in MHz is plotted as the abscissa.

FIG. 5B is a graph showing the input return loss ideally observed after tuning second delay means 22 as hereinafter described; first delay means 18 having been terminated to match the transmission line impedance. In FIG. 5B, power loss ("return loss") in decibels relative to an ideal impedance match represented by a reference line of "0" is plotted as the ordinate, and frequency in MHz is plotted as the abscissa.

FIG. 6A is a graph showing degree of output loop cancellation ideally observed after tuning first delay means 18 as hereinafter described; second delay means 22 having been terminated to match the transmission line impedance. In FIG. 6A, signal attenuation in decibels relative to a reference line of "0" is plotted as the ordinate, and frequency in MHz is plotted as the abscissa.

FIG. 6B is a graph showing the output return loss ideally observed after tuning first delay means 18 as hereinafter described; second delay means 22 having been terminated to match the transmission line impedance. In FIG. 6B, power loss ("return loss") in decibels relative to an ideal impedance match represented by a reference line of "0" is plotted as the ordinate, and frequency in MHz is plotted as the abscissa.

DESCRIPTION OF THE PREFERRED EMBODIMENT

The basic principles of operation of an ideal feedforward amplifier are first described with reference to FIG. 1 to provide those skilled in the art with a framework for understanding the invention.

Figure 1:
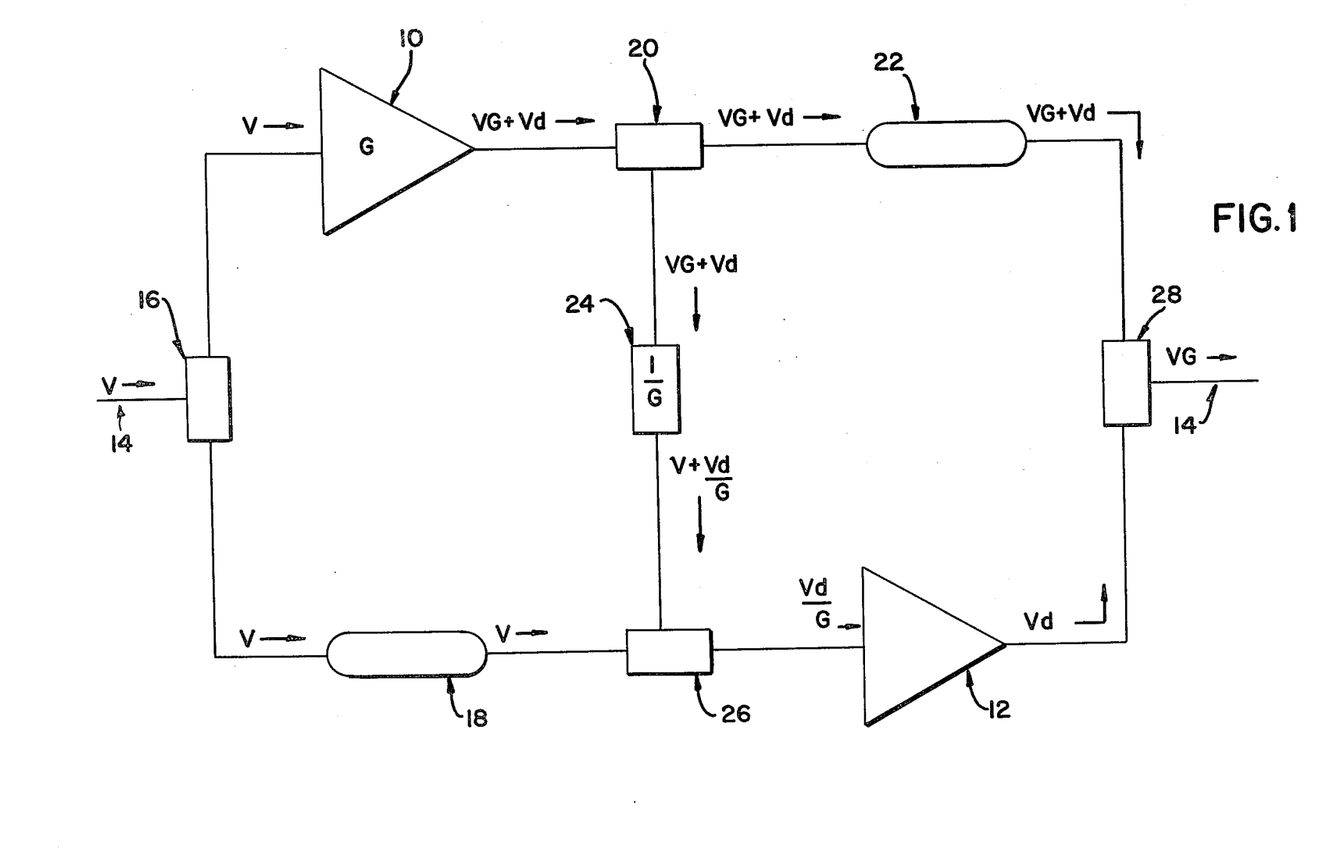
FIG. 1 is a block diagram of an ideal feedforward amplifier.

FIG. 1 is a block diagram of an ideal (lossless) feedforward amplifier which includes a main amplifier 10 and an error amplifier 12. An RF signal "V" which is to be amplified is coupled from cable 14 to first directional coupler 16 which splits the signal into two portions, one of which is delivered to the input terminal of main amplifier 10 and the other of which is delivered to first delay means 18. The amplified signal appearing at the output terminal of main amplifier 10 has the form "VG+$V_d$", where "G" represents the gain of main amplifier 10 and "$V_d$" represents the signal distortion inherently introduced by the amplification process. Ideally, the distortion component $V_d$ is to be eliminated to yield a "pure" amplified signal "VG".

The amplified signal "VG+$V_d$", which is 180° out of phase with respect to the input signal V, is coupled to second directional coupler 20 which splits the amplified signal into two portions, one of which is directed to second delay means 22 and the other of which is directed to attenuator 24. Attenuator 24 is adjusted to attenuate signals passing therethrough by an amount which is inversely proportional to the gain "G" of main amplifier 10. Accordingly, the signal appearing at the output terminal of attenuator 24 has the form "V+$V_d$/G". This attenuated signal portion is coupled to third directional coupler 26 which combines it with the non-amplified signal portion passed through first delay means 18.

First delay means 18 is included to ensure that the non-amplified signal portion reaching third directional coupler 26 will coincide precisely in time with the attenuated signal portion passed to third directional coupler 26 by attenuator 24. If these signals do not coincide precisely in time then undesireable distortion results when they are combined.

Because the attenuated signal portion is 180° out of phase with respect to the non-amplified signal portion, signals in the two portions representative of the input signal "V" cancel one another, so that the signal leaving third directional coupler 26 has the form "$V_d$/G".

Ideally, and to simplify the background discussion, the gain of error amplifier 12 is equal to the gain "G" of main amplifier 10. Thus, a signal representative of the distortion component "$V_d$" introduced by main amplifier 10 appears at the output terminal of error amplifier 12.

Second delay means 22 delays the amplified signal "VG+$V_d$" before presenting it to fourth directional coupler 28 so that it coincides precisely in time with the error amplifer output signal, which is also presented to fourth directional coupler 28. The signal "$V_d$" appearing at the output of error amplifier 12 is 180° out of phase with respect to the signal leaving second delay means 22. Accordingly, when the error amplifier output signal is combined by fourth directional coupler 28 with the output signal from second delay means 22, signal components representative of the distortion "$V_d$" introduced by main amplifier 10 precisely cancel one another, leaving a "pure" amplified signal "VG" for passage along cable 14.

First and second delay means 18 and 22 must be carefully designed to meet two objectives. First, each delay means must delay signals passing therethrough for a precise time interval so that separate signals reaching either of combining couplers 26 or 28 coincide precisely in time. Otherwise, undesirable distortion results. Second, each of first and second delay means 18 and 22 must be carefully impedance matched with the other amplifier circuit components to avoid undesirable signal attenuation caused by impedance mis-matching.

According to the invention, delay means 18 and 22 may each comprise a lumped LC circuit. Conventional circuit design principles suggest that a lumped LC circuit would be incompatible with the two objectives of precise time delay and impedance matching. For example, a lumped LC circuit which has been "tuned" to provide a given time delay would have a fixed impedance which, in all probability, would be seriously mismatched to the characteristic impedance of the amplifier circuit, thus defeating the objective of precise impedance matching. Conversely, a lumped LC circuit having the correct impedance would most likely not yield an appropriate time delay, thus defeating the other objective. Furthermore, signals passing through a lumped LC circuit are delayed in some frequency bands for time periods which are different than the time delay periods in other frequency bands. If attempts are made to "tune" lumped LC circuit, the signal time delay varies between different frequency bands, and, as mentioned above, the circuit impedance changes. However, the inventor has found that; notwithstanding these suggested difficulties, tuneable electronic delay lines comprising lumped LC circuits having time delay and impedance matching properties which are ideally suited to feedforward amplifier applications may be constructed in accordance with the invention.

Figure 3A:
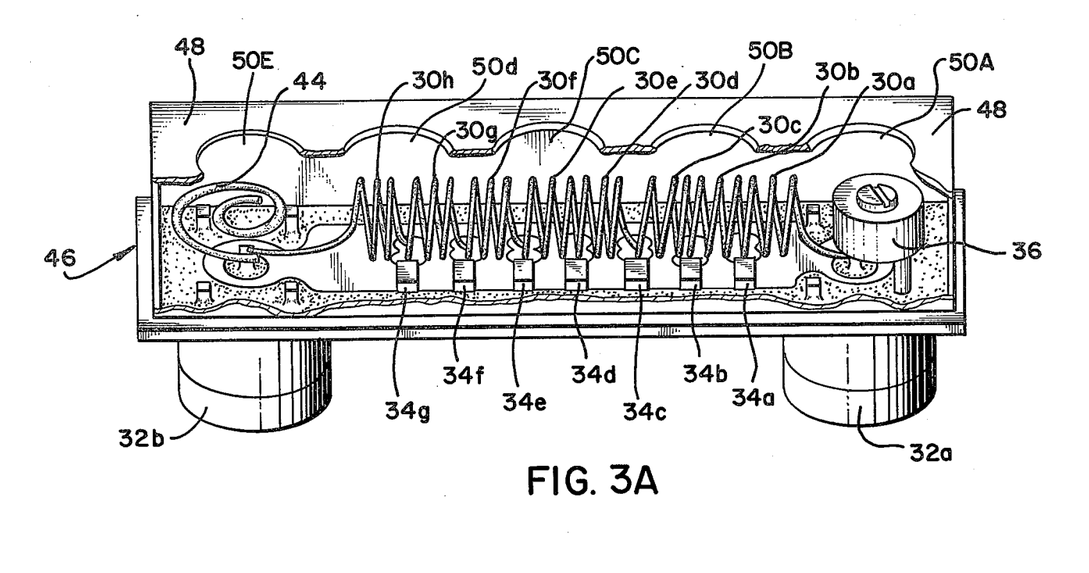
FIG. 3A is a fragmented pictorial view (on an enlarged scale) of a delay line in accordance with the preferred embodiment of the invention.

FIG. 3A is a fragmented pictorial illustration of a tuneable electronic delay line constructed in accordance with the preferred embodiment of the invention. The preferred embodiment hereinafter described is a delay line for a feedforward amplifier operating in the 50 MHz–400 MHz range. The delay line provides a group delay over this frequency range of approximately 4 nanoseconds. Eight inductance coils 30a through 30h are connected in series between first and second delay line end points represented by the central terminals of conventional 75 ohm coaxial cable connectors 32a and 32b. Inductance coils 30a through 30h each comprise three turns of 26 AWG enamel wire. The coils have a diameter of 0.144 inches. Seven shunt capacitors 34a through 34g are connected between each connected inductance coil pair and electrical ground. Shunt capacitors 34a through 34g are each 5.6 pf N.P.O. chip capacitors. Such capacitors are manufactured without protruding wire leads which may introduce undesirable inductances. Furthermore, their capacitance remains substantially unaffected by temperature changes.

The exact number of inductance coils and shunt capacitors may vary with the feedforward amplifier frequency range. As explained above, a lumped LC circuit delays signals in different frequency bands for different time periods. A plurality of inductance coils and shunt capacitors affords a means for adjusting the time delay in different frequency bands and for adjusting the amplifier impedance matching characteristics as hereinafter explained in greater detail. However, the total number of inductance coils and shunt capacitors is, to some extent, dictated by the feedforward amplifier frequency range. For example, it has been found that nine inductance coils and eight shunt capacitors are required to provide adequate time delay in feedforward amplifiers which operate in the 50 MHz–350 MHz frequency range. If the amplifier frequency range is increased to 50 MHz–400 MHz then eight inductance coils and seven shunt capacitors have been found to suffice; whereas seven inductance coils and six shunt capacitors suffice if the amplifier frequency range is further increased to 50 MHz–450 MHz. In each case, the basic layout illustrated in FIG. 3A may be adapted to the desired frequency range of operation by adding or removing inductance coil/shunt capacitor pairs, from the end of the delay line which is closest to coaxial cable connector 32b.

Variable capacitor 36 is connected between the first delay line end point represented by connector 32a and electrical ground. Variable capacitor 36 is a 1–3 pf ceramic N.P.O. One end of a reactive element such as a short coil of wire 44 is connected to the second delay line end point comprising the central terminal of connector 32b. The other end of wire 44 is not connected to anything. Wire 44 provides a small amount of capacitance and inductance relative to electrical ground, which assists in tuning the delay line as hereinafter described.

Figure 3B:
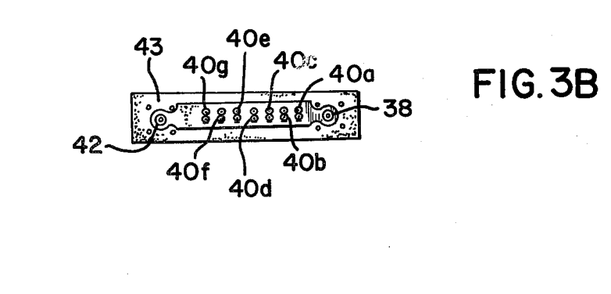
FIG. 3B shows the connection side of a printed circuit board for mounting the delay line of FIG. 3A and for connecting it to a feedforward amplifier.

Inductance coils 30a through 30h, shunt capacitors 34a through 34g, connectors 32a and 32b, variable capacitor 36 and wire coil 44 are mounted on a delay line printed circuit board as is shown in FIG. 3B. Inductance coil 30a is connected between pads 38 and 40a of the printed circuit board. Inductance coils 30b through 30g are connected, respectively, between pad pairs 40a–40b through 40f–40g. Inductance coil 30h is connected between pads 40g and 42. The central terminal of 75 ohm coaxial cable connector 32a is connected to pad 38 and its outer terminals protrude through holes in the ground plane 43 etched around the outer periphery of the circuit board and are connected to the ground plane. 75 ohm coaxial cable connector 32b is connected at the opposite end of the circuit board in similar fashion with its central terminal protruding through and connected to pad 42. Variable capacitor 36 is connected between pad 38 and the circuit board ground plane 43. Wire coil 44 is connected to the central terminal of cable connector 32b at pad 42.

Referring again to FIG. 3A, sheet metal enclosure 46 contains the delay line printed circuit board and closely confines inductance coils 30a through 30h, shunt capacitors 34a through 34g, variable capacitor 36 and wire coil 44. Enclosure 46 is provided with a removable metal lid 48 which has a plurality of apertures 50a through 50e through which the delay line may be tuned as hereinafter described. Metal enclosure 46 and lid 48 have an inherent capacitance relative to the electrical ground potential of the amplifier which serves to shield the delay line circuit components somewhat from the effects of interfering electrical signals produced outside enclosure 46. When the delay line has been tuned as hereinafter described a piece of copper tape is affixed over apertures 50a through 50e to close those apertures and seal the delay line.

Figure 2:
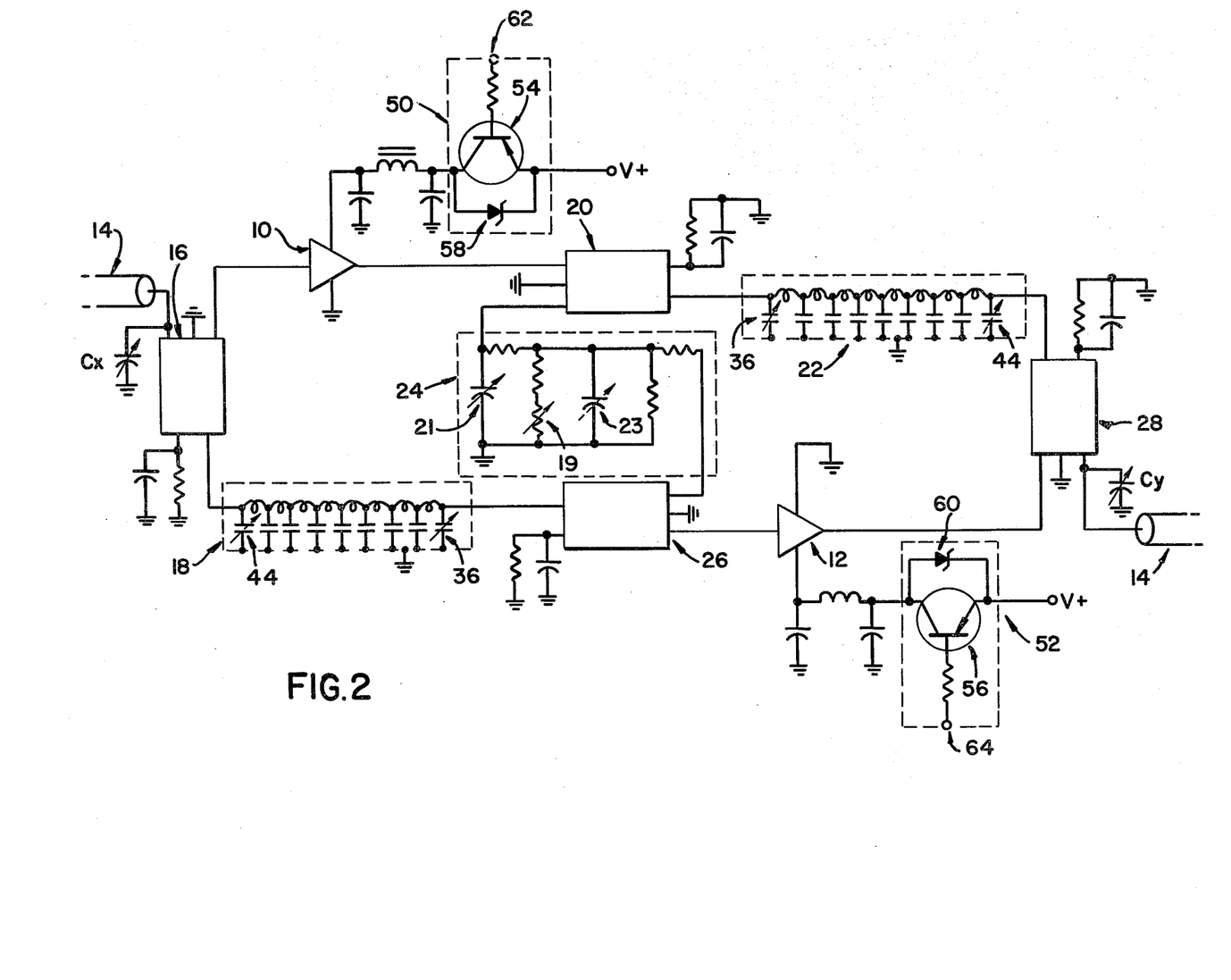
FIG. 2 is a block/schematic diagram of a feedforward amplifier having a delay line in accordance with the preferred embodiment of the invention.

FIG. 2 is a block/schematic diagram of a feedforward amplifier for amplifying signals in the 50 MHz–400 MHz band and having delay lines in accordance with the preferred embodiment. In FIG. 2, amplifier components described above with reference to FIG. 1 bear the same reference numerals as appear in FIG. 1. Parallel connected resistor/capacitor pairs are coupled to each of directional couplers 16, 20, 26 and 28 to provide directivity for the couplers in well known fashion. As hereinafter described, variable capacitors $C_x$ and $C_y$ enable adjustment of the amplifier return loss prior to commencement of the delay line tuning procedure. Delay lines 18 and 22 are represented schematically in FIG. 2 with conventional electrical symbols. In FIG. 2, wire coil 44 included in each of delay lines 18 and 22 is represented as a variable shunt capacitor having a broken arrow therethrough. Note that the end point of delay line 18 to which variable shunt capacitor 36 is connected is coupled to directional coupler 26. The end point of delay line 22 to which variable shunt capacitor 36 is connected is coupled to directional coupler 20.

As shown in FIG. 2, attenuator 24 includes a "T" resistance pad having a variable resistor 19 for adjusting the amount by which signals passing from second directional coupler 20 to third directional coupler 26 are attenuated. Variable capacitors 21 and 23 included in attenuator 24 are used to adjust the amplifier frequency response as hereinafter explained. In practice, variable capacitors 21 and 23 comprise small wire coils connected across resistor 19.

Also shown in FIG. 2 are amplitude modulators 50 and 52 which are included to assist in testing of the feedforward amplifier balance check modulation. Amplitude modulators 50 and 52 include, respectively, PNP transistors 54 and 56 which are shunted, respectively, by zener diodes 58 and 60.

Figure 4:
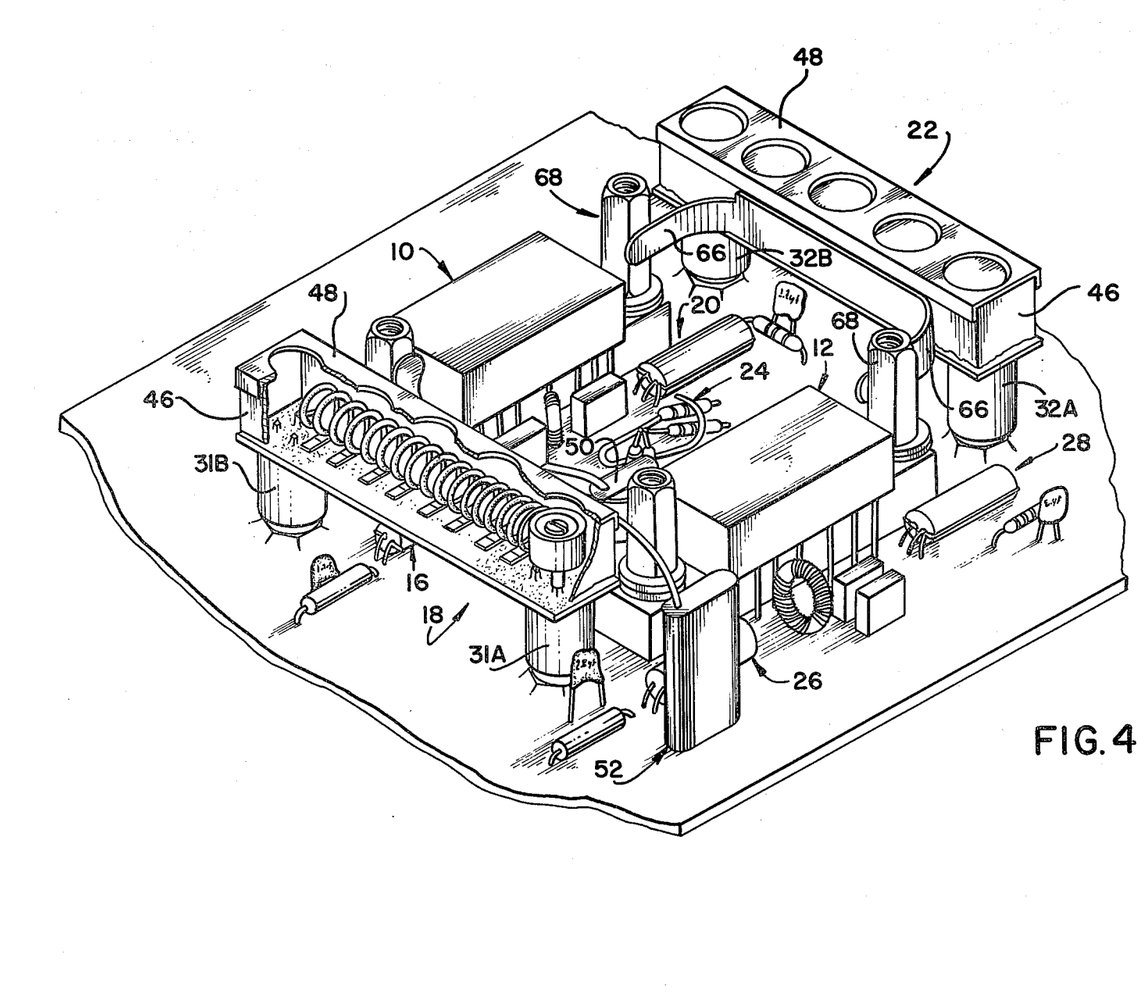
FIG. 4 is a pictorial representation of the circuit components of a feedforward amplifier, including a fragmented pictorial representation of a delay line in accordance with the preferred embodiment of the invention.

FIG. 4 is a pictorial representation of a feedforward amplifier having two delay lines in accordance with the preferred embodiment. FIG. 4 illustrates the manner in which first and second delay means 18 and 22 may respectively be plugged, by means of 75 ohm connector pairs 31a–31b and 32a–32b into mating coaxial cable connector pairs on the amplifier circuit board. FIG. 4 also illustrates the provision of straps 66 which are rigidly affixed to sheet metal enclosures 46 to provide good thermal and electrical conductivity therewith. When first and second delay means 18 and 22 are installed as shown in FIG. 4, straps 66 press firmly against ground posts 68, thereby connecting enclosures 46 to electrical ground. Ground posts 68 protrude through the feedforward amplifier circuit board and are rigidly affixed to heat sinks on the opposite side thereof (not shown). A separate heat sink is provided for each of main amplifier 10 and error amplifier 12. The heat sinks dissipate heat generated by main amplifier 10 and error amplifier 12. Accordingly, ground posts 68 are heated and conduct heat via thermally conductive straps 66 to enclosures 46. Enclosures 46 and the delay line circuit components therein are thus maintained at a relatively constant temperature when the feedforward amplifier is in operation, which minimizes temperature induced changes in the time delay or impedance characteristics of the delay lines.

Preferably, main amplifier 10 and error amplifier 12 are pre-selected in "matched" pairs such that the gain of either amplifier in the pair does not deviate with respect to the gain of the other amplifier by more than 0.25 dB at any frequency between 50 MHz and 400 MHz. If the amplifiers are not matched in this fashion then it would be necessary to include a variable resistor in the feedforward amplifier circuit to compensate for variations in gain between the main and error amplifiers. This is undesirable because the impedance matching characteristics of the overall feedforward amplifier circuit may be upset by the inclusion of such a variable resistor. The foregoing criteria for "matched" amplifier pairs is not unduly restrictive. It has been found, for example, that a random sample of 100 integrated circuit amplifiers such as Motorola MHW4342 or 5342 will yield about 40 matched pairs which satisfy the foregoing criteria.

A feedforward amplifier having delay lines in accordance with the invention is tuned by adjusting the delay lines to provide the proper time delay and impedance matching characteristics so that the amplifier will function as closely as possible in accordance with the theoretical description given above.

Figure 7:
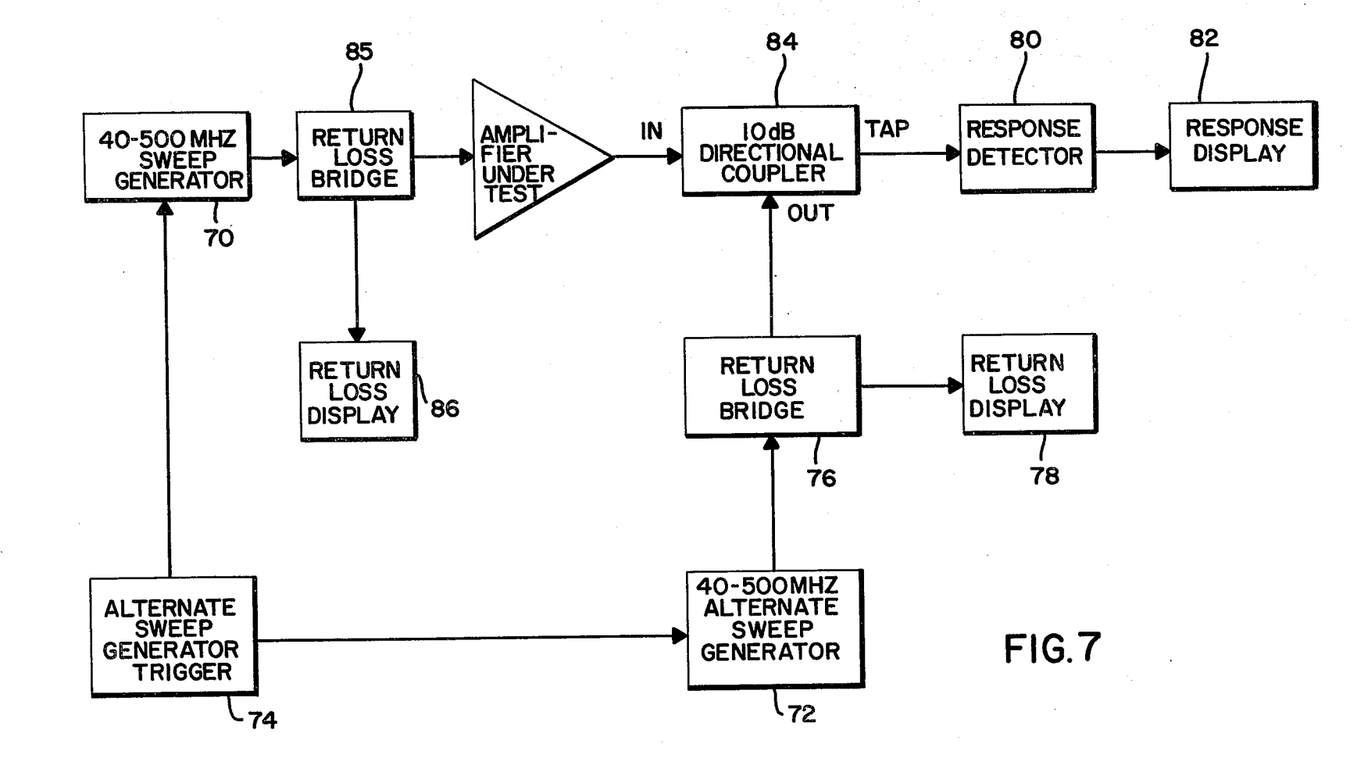
FIG. 7 is a block diagram representation of a test instrument setup for tuning the feedforward amplifier delay lines as hereinafter described.

FIG. 7 illustrates a test instrument setup for tuning the feedforward amplifier previously described. The tuning procedure is as follows:

1. Sweep generator 70 is used to inject a sweep signal of 40–500 MHz bandwidth into third directional coupler 26. The amplified signal appearing at the output of error amplifier 12 is applied to the input terminal of a 10 dB directional coupler 84.

2. Alternate sweep generator 72 is used to inject a second sweep signal having a 40 MHz–500 MHz bandwidth into the output terminal of directional coupler 84. Directional coupler 84 combines the signals originating from sweep generators 70 and 72. Sweep generators 70 and 72 must be alternately triggered by means of a suitable alternate sweep generator trigger 74 so that the sweep signals do not interfere with one another.

3. First return loss bridge 85 is coupled between sweep generator 70 and the input of the amplifier under test to provide, on display 86, an indication of input return loss (FIG. 6B) of the amplifier under test. Second return loss bridge 76 is coupled between alternate sweep generator 72 and the output terminal of directional coupler 84 to provide, on display 78, an indication of output return loss (FIG. 5B) of the amplifier under test.

4. Response detector 80 is tapped to directional coupler 84 to provide, on display 82, an indication of the degree of loop cancellation (FIGS. 5A and 6A) of the amplifier under test.

5. A matched pair of integrated circuit amplifiers are inserted into the feedforward amplifier circuit.

6. First and second delay means 18 and 22 are removed and replaced with 75 ohm terminators.

7. Variable capacitors $C_x$ and $C_y$ are adjusted to minimize return loss of the amplifier under test. This return loss must be adjusted to greater than minus 20 dB (less than 10% reflection).

8. The 75 ohm terminator which replaced second delay means 22 is removed and second delay means 22 is inserted into the feedforward amplifier circuit. The 75 ohm terminator that replaced first delay means 18 is not removed.

Figure 5A:
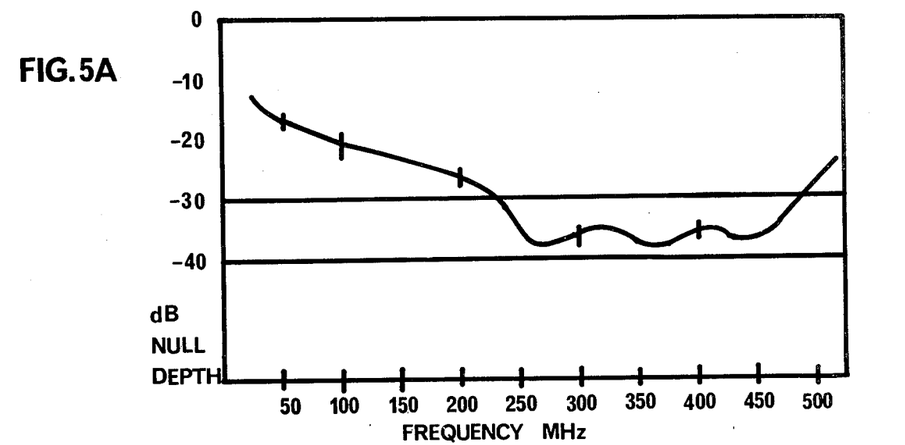
Figure 5B:
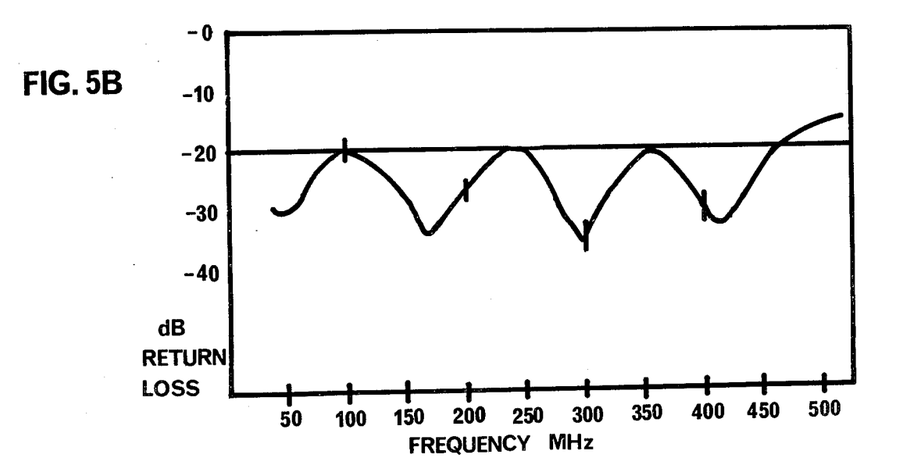

9. Second delay means 22 is tuned by observing the degree of loop cancellation and return loss displayed, respectively, on displays 82 and 78 (FIGS. 5A and 5B respectively). Lid 48 is removed from second delay means 22. Tweezers and a needle point are used to carefully move each of inductance coils 30a through 30h and to simultaneously adjust variable resistor 19 of attenuator 24 so as to "deepen" the overall loop null pattern observed on display 82 (FIG. 5A). Concurrently, variable capacitor 36 is adjusted to minimize the return loss observed on display 78 (FIG. 5B). Simultaneous adjustment of capacitors 21 or 23 in attenuator 24 may affect the degree of loop cancellation observed on display 82, without affecting the return loss observed on display 78.

10. When the best possible loop cancellation and return loss patterns are observed on displays 82 and 78, lid 48 is replaced on second delay means 22. This should improve loop cancellation somewhat without affecting return loss.

11. Additional fine tuning may be accomplished by passing a needle point through any of apertures 50a through 50e in lid 48 to make minor adjustments to the position of any of inductance coils 30a through 30h.

12. Once the desired loop cancellation is obtained, variable resistor 19 and variable capacitors 21 and 23 in attenuator 24 are not further adjusted. A piece of copper tape is placed over apertures 50a through 50e of second delay means 22 to shield it from possible damage or mis-adjustment.

13. Second delay means 22 is removed and replaced with a 75 ohm terminator. The 75 ohm terminator which replaced first delay means 18 is then removed and first delay means 18 is plugged into the circuit.

Figure 6A:
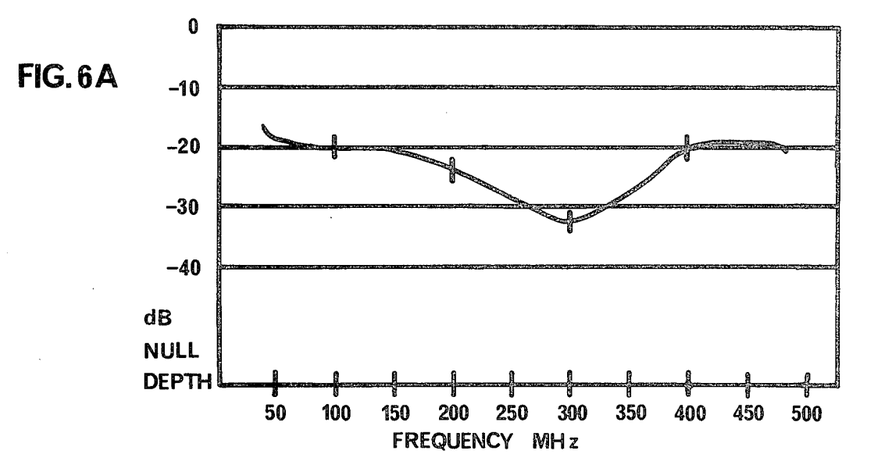
Figure 6B:
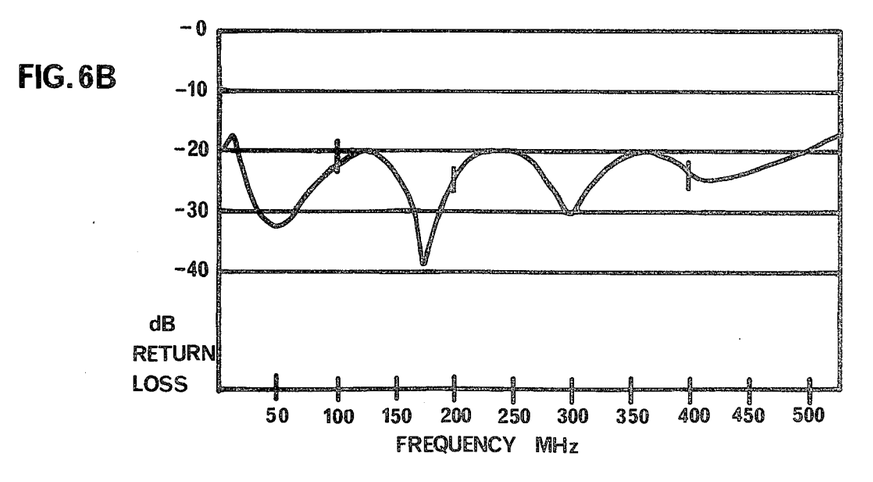

14. First delay means 18 is tuned by repeating steps 9 through 11 above to obtain the best possible loop cancellation and return loss for main amplifier 10 (FIGS. 6A and 6B). First delay means 18 is then sealed with copper tape to protect it from damage or mis-adjustment.

15. Second delay means 22 is reinstalled in the feedforward amplifier circuit and 10 dB directional coupler 84 is removed.

16. The amplifier frequency response is determined by sweeping it with a signal of 1 dB resolution. The amplifier frequency response should vary by no more than about 35 0.2 dB from 40 MHz through 410 MHz.

17. Final balance of the amplifier is achieved by observing the degree of cross-modulation present over the 40 MHz–400 MHz bandwidth. Small changes in balance may be corrected by adjusting resistor 19 in attenuator 24 or by adjusting wire coil 23 which represents a variable shunt capacitor connected across resistor 19. Resistor 19 varies balance over the entire frequency range whereas wire coil 23 affects only high frequency balance.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

I claim:

1. A tuneable lumped LC electronic delay line for delaying RF signals in a bandwidth of at least 100 MHz passing between first and second end points by a substantially constant amount throughout the band, said delay line comprising:
   (a) a plurality of deformable, air coil inductors connected in series between said first and second end points, said inductors being inductively coupled to one another;
   (b) a shunt capacitor connected between each connected inductor pair and electrical ground, each shunt capacitor exhibiting no substantial change in capacitance with change in temperature over a temperature range normal for an out-of-doors environment;
   (c) a variable capacitor connected between said first end point and electrical ground; and
   (d) a reactive element connected to said second end point and reactively coupled to electrical ground.

2. A tuneable electronic delay line as set forth in claim 1 in which the reactive element is capcitively coupled to electrical ground.

3. A tuneable electronic delay line as set forth in claim 2 in which the reactive element is a piece of wire, one end of which is connected to the second end point, the other end not being physically connected to anything, the wire being positioned adjacent, and capacitively coupled to, electrical ground.

4. A tuneable electronic delay line as set forth in claim 1 in which the plurality of air coil inductors are each inductively coupled to all other inductors of the series.

5. A tuneable electronic delay line as set forth in claim 4 in which the air coil inductors are connected substantially in line with one another in a manner permitting them to be bent and turned out of line during tuning, the inductors being connected along their length to pads adjacent an electrical ground plane conductor, the capacitors being connected between the inductor pads and the adjacent ground plane, the inductors after tuning being in various orientations to one another.

6. A tuneable electronic delay line as set forth in claim 4, the delay line being tuneable by deforming the air coil inductors to selectively vary the delay, return loss and signal magnitude characteristics of the delay line.

7. A tuneable electronic delay line as set fourth in claim 4 in which the air coil inductors are formed of wire having substantially the characteristics of 26 AWG enamel wire, and the diameter of the inductive loops formed by the coils is substantially 0.14 inches.

8. a tuneable electronic delay line as defined in claim 1, wherein said inductors and capacitors are closely confined within a metal enclosure, said enclosure including a removeable lid, said enclosure further including a thermally and electrically conductive strap for connecting said enclosure to electrical ground and for conducting heat between said enclosure and electrical ground.

9. A feedforward amplifier, comprising:
   (a) a main amplifier for producing a first output signal;
   (b) an error amplifier for producing a second output signal;
   (c) first and second delay means;
   (d) a first directional coupler for splitting an input RF signal and for directing portions of said signal to the input of said main amplifier and to the input of said first delay means;
   (e) a second directional coupler for splitting said first output signal and for directing portions of said first output signal to the input of said second delay means and to a third directional coupler;
   (f) said third directional coupler for combining the portion of said first output signal received from said second directional coupler with an output signal from said first delay means and for directing the combined signals to the input of said error amplifier;
   (g) a fourth directional coupler for combining an output signal from said second delay means with said second output signal and for directing the combined signals to an output port;

wherein said first and second delay means each comprise:
   (i) a plurality of deformable, air coil inductors connected in series between said first and second end points, said inductors being inductively coupled to one another;
   (ii) a shunt capacitor connected between each connected inductor pair and electrical ground, each shunt capacitor exhibiting no substantial change in capacitance with change in temperature over a temperature range normal for an out-of-doors environment;
   (iii) a variable capacitor connected between said first end point and electrical ground; and
   (iv) a reactive element connected to said second end point and reactively coupled to electrical ground.

10. A feedforward amplifier as defined in claim 9, further comprising a variable gain T resistance pad connected between said second and third directional couplers and electrical ground to provide adjustable attenuation of the portion of said first output signal received from said second directional coupler.

11. A feedforward amplifier as set forth in claim 9 in which the components are symetrical in that the main amplifier and error amplifier are of substantially the same characteristics, and the first and second delay means are of substantially the same characteristics.

12. A feedforward amplifier as set forth in claim 9 in which the reactive element of each delay means is capacitively coupled to electrical ground.

13. A feedforward amplifier as set forth in claim 12 in which each said reactively element is a piece of wire, one end of which is connected to said second end point, the other end of which is not physically connected to anything but is positioned to be capacitively coupled to electrical ground.

14. A feedforward amplifier as set forth in claim 9 in which the air coil inductors of each said delay means are connected substantially in line with one another in a manner permitting them to be deformed, bent and turned out of line during tuning to selectively vary the delay, return loss and signal magnitude characteristics of the delay line.

15. A feedforward amplifier as set forth in claim 9 in which the conductors and capacitors in said first delay means are closely confined within a first metal enclosure, and in which the inductors and capacitors in said second delay means are closely confined within a second metal enclosure, each of said metal enclosures including a removable lid.

16. A feedforward amplifier as set forth in claim 15 and further including a thermally and electrically conductive strap for connecting said enclosures to electrical ground and for conducting heat between said enclosures and electrical ground.

* * * * *